(12) United States Patent
Usikov et al.

(10) Patent No.: US 8,673,074 B2
(45) Date of Patent: Mar. 18, 2014

(54) GROWTH OF PLANAR NON-POLAR {1 -1 0 0} M-PLANE AND SEMI-POLAR {1 1 -2 2} GALLIUM NITRIDE WITH HYDRIDE VAPOR PHASE EPITAXY (HVPE)

(75) Inventors: Alexander Usikov, Rockville, MD (US); Alexander Syrkin, Montgomery Village, MD (US); Robert G. W. Brown, Tustin, CA (US); Hussein S. El-Ghoroury, Carlsbad, CA (US); Philippe Spiberg, Laguna Beach, CA (US); Vladimir Ivantsov, Adelphi, MD (US); Oleg Kovalenkov, Montgomery Village, MD (US); Lisa Shapovalova, Gaithersburg, MD (US)

(73) Assignee: Ostendo Technologies, Inc., Carlsbad, CA (US)

( * ) Notice: Subject to any disclaimer, the term of this patent is extended or adjusted under 35 U.S.C. 154(b) by 1123 days.

(21) Appl. No.: 12/503,656

(22) Filed: Jul. 15, 2009

(65) Prior Publication Data

US 2010/0012948 A1   Jan. 21, 2010

Related U.S. Application Data

(60) Provisional application No. 61/081,145, filed on Jul. 16, 2008.

(51) Int. Cl.
*C30B 23/00* (2006.01)

(52) U.S. Cl.
USPC .............. 117/101; 117/84; 117/105; 117/106

(58) Field of Classification Search
None
See application file for complete search history.

(56) References Cited

U.S. PATENT DOCUMENTS

| | | | |
|---|---|---|---|
| 5,923,950 | A | 7/1999 | Ishibashi et al. |
| 6,045,626 | A | 4/2000 | Yano et al. |
| 6,064,078 | A | 5/2000 | Northrup et al. |
| 6,069,021 | A | 5/2000 | Terashima et al. |
| 6,072,197 | A | 6/2000 | Horino et al. |
| 6,156,581 | A | 12/2000 | Vaudo et al. |

(Continued)

FOREIGN PATENT DOCUMENTS

| | | |
|---|---|---|
| CN | 101138091 | 3/2008 |
| EP | 1385196 | 1/2004 |

(Continued)

OTHER PUBLICATIONS

Tsvetkov et al. "Growth of Submicron AlGaN/GaN/AlGaN Heterostructures by Hydride Vapor Phase Epitaxy (HVPE)", Phys. Stat. Sol. A, 2001, v. 188, No. 1, pp. 429-432.*

(Continued)

*Primary Examiner* — Yelena G Gakh
(74) *Attorney, Agent, or Firm* — Blakely Sokoloff Taylor & Zafman LLP

(57) ABSTRACT

A method of growing planar non-polar m-plane or semi-polar III-Nitride material, such as an m-plane gallium nitride (GaN) epitaxial layer, wherein the III-Nitride material is grown on a suitable substrate, such as an m-plane sapphire substrate, using hydride vapor phase epitaxy (HVPE). The method includes in-situ pretreatment of the substrate at elevated temperatures in an atmosphere of ammonia and argon, growing an intermediate layer such as an aluminum nitride (AlN) or aluminum-gallium nitride (AlGaN) on the annealed substrate, and growing the non-polar m-plane III-Nitride epitaxial layer on the intermediate layer using HVPE.

1 Claim, 6 Drawing Sheets

(56) References Cited

U.S. PATENT DOCUMENTS

| | | | |
|---|---|---|---|
| 6,201,262 | B1 | 3/2001 | Edmond et al. |
| 6,218,269 | B1 | 4/2001 | Nikolaev et al. |
| 6,440,823 | B1 | 8/2002 | Vaudo et al. |
| 6,468,882 | B2 | 10/2002 | Motoki et al. |
| 6,573,164 | B2 | 6/2003 | Tsvetkov et al. |
| 6,613,143 | B1 | 9/2003 | Melnik et al. |
| 6,616,757 | B1 | 9/2003 | Melnik et al. |
| 6,627,552 | B1 | 9/2003 | Nishio et al. |
| 6,656,272 | B2 | 12/2003 | Tsvetkov et al. |
| 6,656,285 | B1 | 12/2003 | Melnik et al. |
| 6,660,083 | B2 | 12/2003 | Tsvetkov et al. |
| 6,706,119 | B2 | 3/2004 | Tsvetkov et al. |
| 6,890,809 | B2 | 5/2005 | Karpov et al. |
| 6,936,357 | B2 | 8/2005 | Melnik et al. |
| 7,091,514 | B2 | 8/2006 | Craven et al. |
| 7,220,324 | B2 | 5/2007 | Baker et al. |
| 7,220,658 | B2 | 5/2007 | Haskell et al. |
| 7,279,047 | B2 | 10/2007 | Melnik et al. |
| 7,338,828 | B2 | 3/2008 | Imer et al. |
| 7,361,576 | B2 | 4/2008 | Imer et al. |
| 7,427,555 | B2 | 9/2008 | Haskell et al. |
| 7,501,023 | B2 | 3/2009 | Dmitriev et al. |
| 7,575,947 | B2 | 8/2009 | Iza |
| 7,611,586 | B2 | 11/2009 | Melnik et al. |
| 7,670,435 | B2 | 3/2010 | Tsvetkov et al. |
| 7,687,293 | B2 | 3/2010 | Sato et al. |
| 7,691,658 | B2 | 4/2010 | Kaeding et al. |
| 7,704,331 | B2 | 4/2010 | Baker et al. |
| 7,727,333 | B1 | 6/2010 | Syrkin et al. |
| 7,846,757 | B2 | 12/2010 | Farrell, Jr. et al. |
| 7,858,996 | B2 | 12/2010 | Zhong et al. |
| 8,404,042 | B2 | 3/2013 | Mizuhara et al. |
| 2002/0074552 | A1 | 6/2002 | Weeks, Jr. et al. |
| 2002/0085603 | A1 | 7/2002 | Okumura |
| 2002/0187356 | A1 | 12/2002 | Weeks, Jr. et al. |
| 2003/0198837 | A1 | 10/2003 | Craven et al. |
| 2004/0094773 | A1 | 5/2004 | Kiyoku et al. |
| 2004/0251471 | A1 | 12/2004 | Dwilinski et al. |
| 2004/0261692 | A1 | 12/2004 | Dwilinski et al. |
| 2005/0205884 | A1 | 9/2005 | Kim et al. |
| 2005/0245095 | A1 | 11/2005 | Haskell et al. |
| 2006/0138431 | A1 | 6/2006 | Dwilinski et al. |
| 2006/0205199 | A1 | 9/2006 | Baker et al. |
| 2006/0270087 | A1 | 11/2006 | Imer et al. |
| 2007/0015345 | A1 | 1/2007 | Baker et al. |
| 2007/0093073 | A1 | 4/2007 | Farrell et al. |
| 2007/0111531 | A1 | 5/2007 | Baker et al. |
| 2007/0218655 | A1 | 9/2007 | Sato et al. |
| 2009/0197118 | A1 | 8/2009 | Nagai et al. |

FOREIGN PATENT DOCUMENTS

| | | |
|---|---|---|
| EP | 1993150 | 11/2008 |
| JP | 2001-342100 | 12/2001 |
| JP | 2008-143772 | 6/2008 |
| TW | 200741822 | 11/2007 |
| WO | WO-03/089694 | 10/2003 |
| WO | WO-2006/099138 | 9/2006 |
| WO | WO-2007/084782 | 7/2007 |
| WO | WO 2007084782 A2 * | 7/2007 |
| WO | WO-2008/059875 | 5/2008 |

OTHER PUBLICATIONS

"Final Office Action Dated Nov. 25, 2011, U.S. Appl. No. 12/614,313".

"Office Action Dated Mar. 21, 2011, U.S. Appl. No. 12/614,313".

Baker, Troy J., et al., "Characterization of Planar Semipolar Gallium Nitride Films on Spinel Substrates", *Japanese Journal of Applied Physics*, vol. 44, No. 29, (2005), pp. L 920-L 922.

Haskell, Benjamin A., et al., "Microstructure and Enhanced Morphology of Planar Nonpolar m-Plane GaN Grown by Hydride Vapor Phase Epitaxy" *Journal of Electronic Materials*, vol. 34, No. 4, (2005), pp. 357-360.

Matsuoka, T, et al., "GaN Growth on Novel Lattice-Matching Substrate: Tilted M-Plane Sapphire", *phys. stat. sol. (a)* 188, No. 2, (2001), pp. 485-489.

Sasaki, Hitoshi, et al., "Effect of aluminum carbide buffer layer on growth and self-separation of m-plane GaN by hydride vapor phase epitaxy" *Phys. Status Solidi A* 206, No. 6, (2009), pp. 1160-1163.

Wei, Tongbo, et al., "Microstructure and Optical Properties of Nonpolar m-Plane GaN Films Grown on m-Plane Sapphire by Hydride Vapor Phase Epitaxy", *The Japan Society of Applied Physics*, vol. 47, No. 5, (2008), pp. 3346-3349.

Zhu, Tiankai, et al., "M-Plane GaN Grown on m-Plane Sapphire by Hydride Vapor Phase Epitaxy", *Japanese Journal of Applied Physics*, vol. 48, (2009), 3 Pages Total.

Amano, H., et al., "Metalorganic vapor phase epitaxial growth of a high quality GaN film using an AlN buffer layer", *Applied Physics Letters*, vol. 48, No. 5, (Feb. 3, 1986), pp. 353-355.

Amano, Hiroshi, et al., "Stress and Defect Control in GaN Using Low Temperature Interlayers", *Japanese Journal of Applied Physics*, vol. 37, Part 2, No. 12B, (Dec. 15, 1998), pp. L1540-L1542.

Chakraborty, Arpan, et al., "Demonstration of Nonpolar m-Plane InGaN/GaN Light Emitting Diodes on Free-Standing m-Plane GaN Substrates", *Japanese Journal of Applied Physicss*, vol. 44, No. 5, (2005), pp. L173-L175.

Chakraborty, Arpan et al., "Nonpolar InGaN/GaN emitters on reduced-defect lateral epitaxially overgrown a-plane GaN with drive-current-independent electroluminescence emission peak", *Applied Physics Letters*, vol. 85, No. 22, (Nov. 29, 2004), pp. 5143-5145.

Chen, Changqing, et al., "A New Selective Area Lateral Epitaxy Approach for Depositing a-Plane GaN over r-Plane Sapphire", *Japanese Journal of Applied Physics*, vol. 42, Part 2, No. 7B, (Jul. 15, 2003), pp. L818-L820.

Chitnis, Ashay, et al., "Visible light-emitting diodes using a-plane GaN-InGaN multiple quantum wells over r-plane sapphire", *Applied Physics Letters*, vol. 84, No. 18, (May 3, 2004), pp. 3663-3665.

Craven, Michael D., et al., "Characterization of a-Plane GaN/(Al,Ga)N Multiple Quantum Wells Grown via Metalorganic Chemical Vapor Deposition", *Japanese Journal of Applied Physics*, vol. 42, Part 2, No. 3A, (Mar. 1, 2003), pp. L235-L238.

Craven, M. D., et al., "Structural characterization of nonpolar (1120) a-plane GaN thin films grown on (1102) r-plane sapphire", *Applied Physics Letters*, vol. 81, No. 3, (Jul. 15, 2002), pp. 469-471.

Craven, M. D., et al., "Threading dislocation reduction via laterally overgrown nonpolar (1120) a-plane GaN", *Applied Physics Letters*, vol. 81, No. 7, (Aug. 12, 2002), pp. 1201-1203.

Dovidenko, K., et al., "Characteristics of stacking faults in AlN thin films", *Journal of Applied Physics*, vol. 82, No. 9, (Nov. 1, 1997), pp. 4296-4299.

Gardner, N. F., et al., "Polarization anisotropy in the electroluminescence of m-plane InGaN-GaN multiple-quantum-well light-emitting diodes" *Applied Physics Letters*, vol. 86, (2005), pp. 111101-1-111101-3.

Grzegory, I., et al., "Seeded growth of GaN at high N2 pressure on (0 0 0 1) polar surfaces of GaN single crystalline substrates", *Materials Science in Semiconductor Processing 4*, (2001), pp. 535-541.

Gu, Shulin, et al., "The impact of initial growth and substrate nitridation on thick GaN growth on sapphire by hydride vapor phase epitaxy", *Journal of Crystal Growth*, vol. 231, (2001), pp. 342-351.

Iwaya, Motoaki, et al., "Reduction of Etch Pit Density in Organometallic Vapor Phase Epitaxy-Grown GaN on Sapphire by Insertion of a Low-Temperature-Deposited Buffer Layer between High-Temperature-Grown GaN", *Japanese Journal of Applied Physics*, vol. 37, Part 2, No. 3B, (Mar. 15, 1998), pp. L316-L318.

Kuokstis, E., et al., "Polarization effects in photoluminescence of C- and M-plane GaN/AlGaN multiple quantum wells", *Applied Physics Letters*, vol. 81, No. 22, (Nov. 25, 2002), pp. 4130-4132.

Maruska, H. P., et al., "Development of 50 mm Diameter Non-Polar Gallium Nitride Substrates for Device Applications", *IEEE International Conference on Indium Phosphide and Related Materials*, (May 12-16, 2003), pp. 567-570.

Metzger, TH., et al., "X-Ray Diffraction Study of Gallium Nitride Grown by MOCVD", *physica status solidi (b)*, vol. 193, Issue 2, (Feb. 1, 1996), pp. 391-397.

(56) References Cited

OTHER PUBLICATIONS

Moe, Craig G., et al., "Milliwatt Power Deep Ultraviolet Light Emitting Diodes Grown on Silicon Carbide", *Japanese Journal of Applied Physics*, vol. 44, No. 17, (Apr. 8, 2005), pp. L502-L504.

Ng, H. M., "Molecular-beam epitaxy of GaN/AlxGa1-xN multiple quantum wells on R-plane (1012) sapphire substrates", *Applied Physics Letters*, vol. 80, No. 23, (Jun. 10, 2002), pp. 4369-4371.

Ohba, Y., et al., "A study on strong memory effects for Mg doping in GaN metalorganic chemical vapor deposition", *Journal of Crystal Growth*, vol. 145, (1994), pp. 214-218.

Sano, Masatoshi, et al., "Epitaxial Growth of Undoped and Mg-Doped GaN", *Japanese Journal of Applied Physics*, vol. 15, No. 10, (Oct. 1976), pp. 1943-1950.

Sun, Chien-Jen, et al., "Comparison of the physical properties of GaN thin films deposited on (0001) and (0112) sapphire substrates", *Applied Physics Letters*, vol. 63, No. 7, (Aug. 16, 1993), pp. 973-975.

Sun, Yue J., et al., "In surface segregation in M-plane (In,Ga)N/GaN multiple quantum well structures", *Applied Physics Letters*, vol. 83, No. 25, (Dec. 22, 2003), pp. 5178-5180.

"International Search Report and Written Opinion of the International Searching Authority Dated Jan. 7, 2010", International Application No. PCT/US2009/050867.

Armitage, R., et al., "M-plane GaN grown on m-sapphire by metalorganic vapor phase epitaxy", *Applied Physics Letters*, vol. 92, (2008), pp. 092121-1 to 092121-3.

Guhne, T., et al., "Demonstration of semipolar (11-22) InGaN/GaN blue-green light emitting diodes", *Electronics Letters*, vol. 44, No. 3, (Jan. 31, 2008).

Hikosaka, T., et al., "Fabrication and properties of semi-polar (1-101) and (11-12) InGaN/GaN light emitting diodes on patterned Si substrates", *physica status solidi (c)*, vol. 5, No. 6, (2008), pp. 2234-2237.

Sharma, R., et al., "Demonstration of a semipolar (1013) InGaN/GaN green light emitting diode", *Applied Physics Letters*, vol. 87, (2005), 231110-1 to 231110-3.

Usikov, A., et al., "New results on HVPE growth of AlN, GaN, InN and their alloys", *Physica Status Solidi C 5*, No. 6, (2008), pp. 1825-1828.

Aujol, E., et al., "Thermodynamical and kinetic study of the GaN growth by HVPE under nitrogen", *Journal of Crystal Growth*, 222, (2001), pp. 538-548.

Wikipedia, "Ammonium chloride", Obtained from the Internet Mar. 13, 2013 at http://en.wikipedia.org/wiki/Ammonium_chloride, (Mar. 2, 2013), 5 pp. total.

"Office Action Dated Sep. 24, 2012, Chinese Patent Application No. 200980127776.7", (Sep. 24, 2012).

"Brief Communication re Oral Proceedings dated Dec. 11, 2012, European Patent Application No. 09790542.6", (Dec. 11, 2012).

"Communication pursuant to Article 94(3) EPC dated Dec. 15, 2011, European Patent Application No. 09790542.6", (Dec. 15, 2011).

"Communication pursuant to Article 94(3) EPC dated Jul. 22, 2011, European Patent Application No. 09790542.6", (Jul. 22, 2011).

"Communication pursuant to Rules 161(1) and 162 EPC dated Mar. 1, 2011, European Patent Application No. 09790542.6", (Jan. 3, 2011).

"Communication under Rule 71(3) EPC dated Dec. 19, 2012, European Patent Application No. 09790542.6", (Dec. 19, 2012).

"International Search Report and Written Opinion of the International Searching Authority Dated Feb. 10, 2011", International Application No. PCT/US2010/055324, (Feb. 10, 2011).

"Office Action Dated Dec. 20, 2012, U.S. Appl. No. 12/614,313", (Dec. 20, 2012).

"Summons to attend oral proceedings pursuant to Rule 115(1) EPC dated Jul. 26, 2012, European Patent Application No. 09790542.6", (Jul. 26, 2012).

"Office Action Dated Jun. 18, 2013; U.S. Appl. No. 12/614,313", (Jun. 18, 2013).

"Office Action Dated Jun. 19, 2013; Chinese Patent Application No. 200980127776.7", (Jun. 19, 2013).

"Notice of Allowance Dated Aug. 29, 2013; U.S. Appl. No. 12/614,313", (Aug. 29, 2013).

"Office Action Dated Oct. 31, 2013; Chinese Patent Application No. 200980127776.7", (Oct. 31, 2013).

"Office Action Dated Sep. 10, 2013; Japanese Patent Application No. 2011-518917", (Sep. 10, 2013).

\* cited by examiner

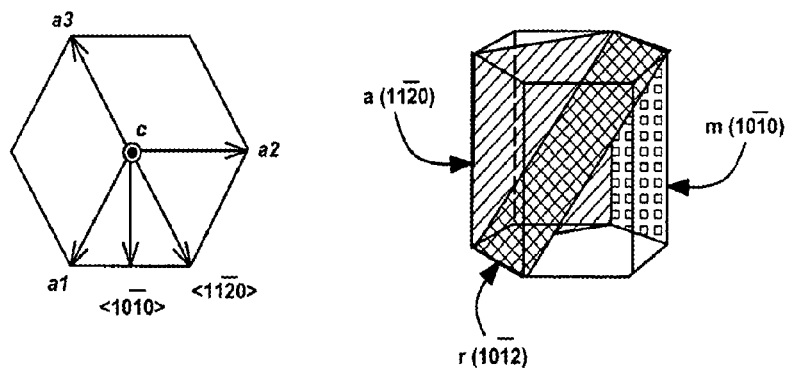
FIG. 1(a)
(Prior Art)
FIG. 1(b)
(Prior Art)
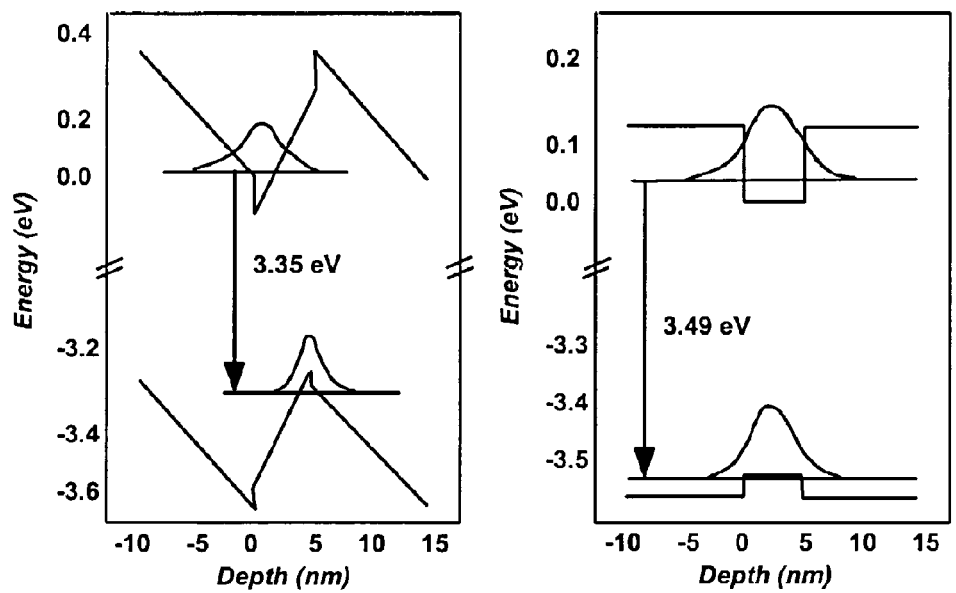
FIG. 2(a)
(Prior Art)
FIG. 2(b)
(Prior Art)

GROWTH OF PLANAR NON-POLAR {1 -1 0 0} M-PLANE AND SEMI-POLAR {1 1 -2 2} GALLIUM NITRIDE WITH HYDRIDE VAPOR PHASE EPITAXY (HVPE)

CROSS-REFERENCE TO RELATED APPLICATION

This application claims the benefit of U.S. Provisional Patent Application No. 61/081,145 filed Jul. 16, 2008.

BACKGROUND OF THE INVENTION

1. Field of the Invention

The present invention relates to the growth of planar non-polar {1-100} and semi-polar {11-22} gallium nitride (GaN) with hydride vapor phase epitaxy (HVPE).

2. Prior Art

Gallium nitride (GaN) and its related compounds are prime candidates for fabrication of advanced visible and ultraviolet high-power and high-performance optoelectronic devices and electronic devices. These devices are typically grown epitaxially by growth techniques including molecular beam epitaxy (MBE), metalorganic chemical vapor deposition (MOCVD), or hydride vapor phase epitaxy (HVPE).

The selection of substrate is critical for achieving the desired GaN growth orientation. Some of the most widely used substrates for III-N growth include SiC, $Al_2O_3$, and $LiAlO_2$. Various crystallographic orientations of these substrates are commercially available.

FIGS. 1(a) and 1(b) are schematics of crystallographic directions and planes of interest in crystal cell of hexagonal wurtzite GaN. Specifically, these schematics show the different crystallographic growth directions and also the planes of interest in the hexagonal wurtzite GaN structure, wherein FIG. 1(a) shows the crystallographic directions a1, a2, a3, c, <10-10> and <11-20>, and FIG. 1(b) shows planes a (11-20), m (10-10) and r (10-12). The fill patterns of FIG. 1(b) are intended to illustrate the planes of interest, but do not represent the materials of the structure.

It is relatively easy to grow planar c-plane GaN due to its large growth stability window. Therefore, nearly all GaN-based devices are grown parallel to the polar c-plane. However, as a result of c-plane growth, each material layer suffers from separation of electrons and holes to opposite faces of the layers due to spontaneous polarization. Furthermore, strain at the interfaces between adjacent layers gives rise to piezoelectric polarization, causing further charge separation.

FIGS. 2(a) and 2(b), which are schematics of band bending and electron hole separation in a quantum well sandwiched between to barriers as a result of polarization, show this effect, wherein FIG. 2(a) is a graph of energy (eV) vs. depth (um) and represents a c-plane quantum well, while FIG. 2(b) is a graph of energy (eV) vs. depth (um) and represents a non-polar quantum well.

Such polarization effects decrease the likelihood of electrons and holes recombining, causing the final device to perform poorly. One possible approach for minimizing or eliminating piezoelectric polarization effects in GaN optoelectronic devices is to grow the devices on semi-polar planes of the crystal such as [11-22] plane or non-polar planes of the crystal such as a-{11-20} and m-{1-100} planes family of GaN. Such planes contain equal numbers of Ga and N atoms and are charge-neutral.

Planar {1-100} m-plane GaN growth has been developed by HVPE and MBE methods but only successfully on m-plane GaN substrates. However, prior to the invention described herein, planar semi-polar and non-polar GaN growth on sapphire had not been accomplished with HVPE.

BRIEF DESCRIPTION OF THE DRAWINGS

Referring now to the drawings in which like reference numbers represent corresponding parts throughout:

FIGS. 1(a) and 1(b) are schematics of crystallographic directions and planes of interest in hexagonal GaN.

FIGS. 2(a) and 2(b) are schematics of band bending and electron hole separation as a result of polarization.

In FIG. 3(a), X-ray diffraction measured using a 2theta/omega scan for GaN layer directly deposited on the m-plane sapphire is shown. The XRD spectrum demonstrates the presence of only semi-polar (11.2) GaN layer. In FIG. 3(b), X-ray diffraction measured using a 2theta/omega scan for GaN layer directly deposited on the m-plane sapphire is shown. The XRD spectrum demonstrates the presence if only semi-polar (10.3) GaN layer. In FIG. 3(c), X-ray (11.2)μ-scan rocking curve for 18 μm thick GaN layer on m-plane sapphire is shown. The FWHM of the rocking curve is 402 arc sec.

DETAILED DESCRIPTION OF THE PREFERRED EMBODIMENTS

Figure 3A:
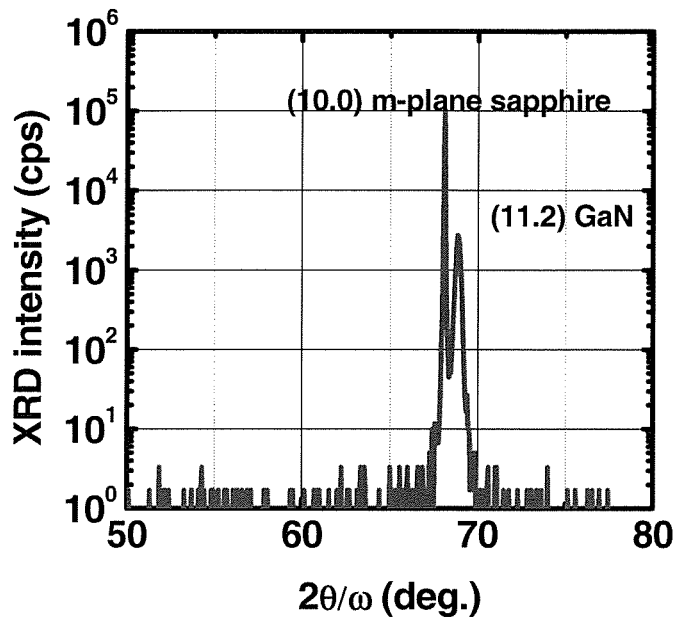
FIGS. 3(a), 3(b) and 3(c) provide a structural characterization by means of X-ray diffraction of semi-polar planar GaN on m-plane.
Figure 3B:
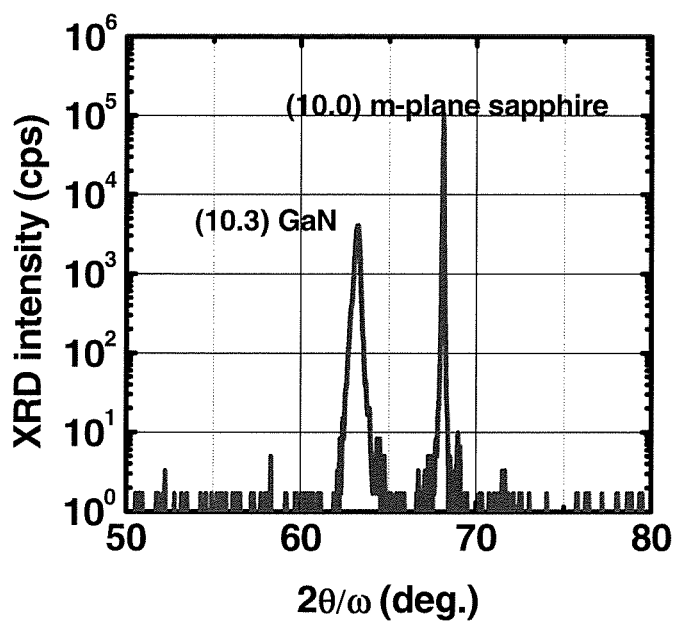

The general purpose of the present invention is to grow planar semi-polar {11-22} plane GaN material using HVPE. The method includes in-situ pretreatment of the substrate at elevated temperatures in an atmosphere of ammonia and argon, growing an intermediate layer such as an aluminum nitride (AlN) or aluminum-gallium nitride (AlGaN) on the annealed substrate, and growing the non-polar m-plane III-Nitride epitaxial layer on the intermediate layer using HVPE.

The present invention takes advantage of semi-polar nature of m-plane GaN to reduce greatly polarization fields, and gives raise to flexibility in growth variables, such as temperature, pressure and precursor flows, utilizing the advantage of semi-polar-GaN stability during growth.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The growth of (Ga, In, Al, B) N materials in the polar [0001]c-direction causes lower performance in optical devices due to polarization fields causing charge separation along the primary conduction direction. Therefore, recent research has been conducted focusing on semi-polar and non-polar direction growth along a-[11-20] and m-[1-100] directions of these materials to eliminate such effects and so to improve the device performance significantly. Both a-plane and m-plane growth of GaN has been explored by HVPE and MBE, but only successfully on m-plane GaN substrates, which are very small and very expensive. For m-plane and semi-polar growth, large area substrate availability has been a problem with the emergence of commercially obtainable m sapphire substrates, which are stable during HVPE growth, the current invention was made possible. The present invention is the first ever successful growth of semi-polar-{11-22} and {10-13} plane GaN on m sapphire by HVPE.

Technical Description

The m-plane sapphire substrate is annealed in an atmosphere of ammonia and hydrogen chloride. Prior to growth, an AlN or AlGaN layer is formed as intermediate layer before GaN film growth. Finally, a GaN layer is grown by HVPE. FIG. 1(a) and FIG. 1(b) illustrates the semi-polar GaN (11-22) crystal plane of interest in the wurtzite crystal configuration.

To accomplish semi-polar GaN growth, V/III ratios of 6-15 and temperature series of 900° C. to 1050° C. for AlN, AlGaN and GaN layers were tested, respectively. The growth was performed at atmospheric pressure. The semi-polar plane, for AlN, AlGaN, and GaN, was stable over this wide range of temperatures, reactor pressures: and precursor flows.

The optimum AlGaN intermediate layers, leading to best quality GaN films, were realized at temperatures over 900° C., and V/III ratio of 15-25 with the intermediate layer thickness below 100 nm. For GaN layer epitaxy, the most favorable conditions were realized at near atmospheric pressures, temperatures in the range of 900° C. to 1050° C., and at V/III ratios below 15.

Figure 4:
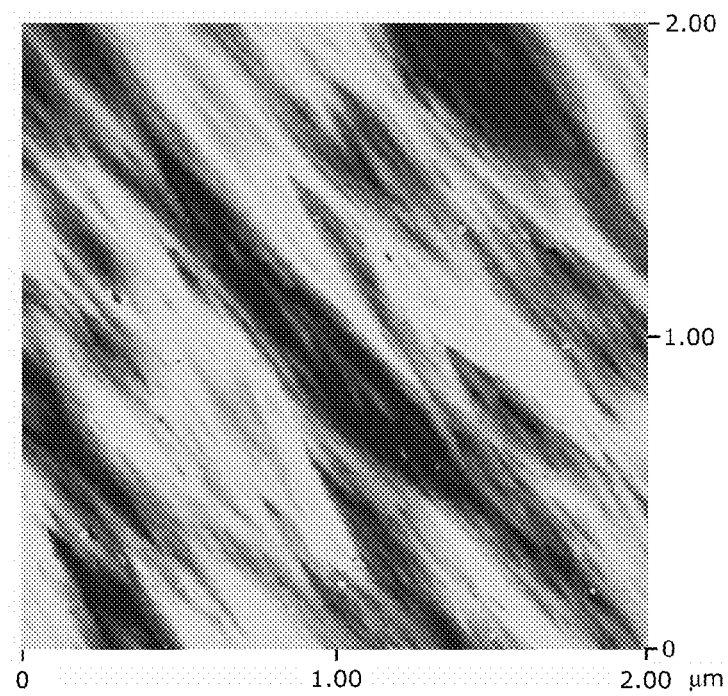
FIG. 4 is a (size) atomic force microscopy (AFM) surface image with s surface roughness value rms of 3.75 nm.
Figure 4:
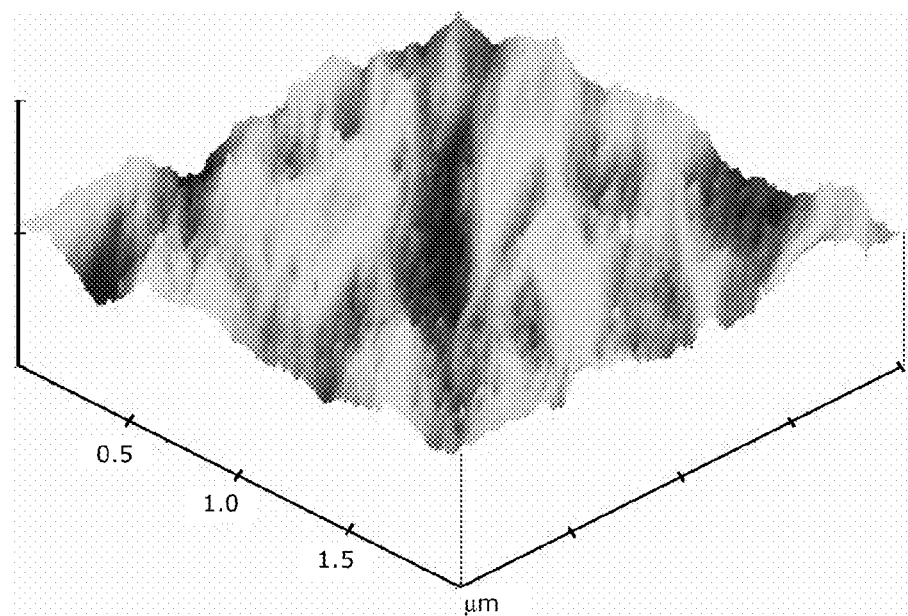

A 2 μm×2 μm atomic force microscopy (AFM) surface image of the resulting semi-polar GaN material is shown in FIG. 4. The surface roughness value (root mean square) is 3.75 nm for a (size) scan.

Figure 3C:
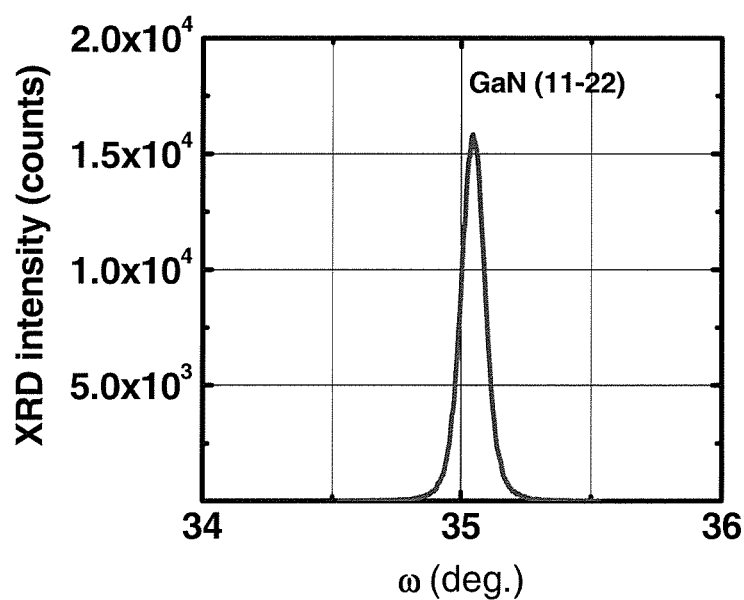

FIG. 3(c) is a graph of omega (degrees) vs. counts/second showing the x-ray diffraction rocking curves for 18 μm thick (11-22) semi-polar GaN layer on-axis (11-22) full width at half max (FWHM) value is measured as low as 402 arc sec. As can been seen from Table 1 below, on-axis (11-22) FWHM values for 33 μm thick GaN are measured as low as 293 arc sec and the off-axis (11-10) reflection has FWHM value of 250 arc sec. These roughness and FWHM values were found to not change significantly by changing growth conditions of the nucleation layer and epitaxial GaN film itself.

TABLE 1

Rocking curve FWHM values

| Semi-Polar On-Axis Values | Semi-Polar Off-Axis Values |
|---|---|
| 293 | 250 |

Process Steps

Figure 5:
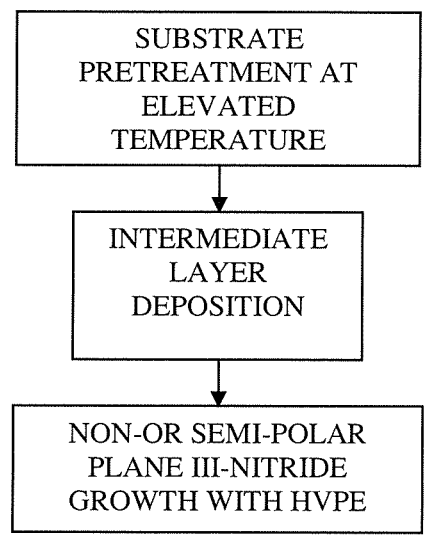
FIG. 5 is a flowchart that illustrates the processing steps for growing planar semi-polar III-Nitrides using HVPE according to the preferred embodiment of the present invention.
Figure 6:
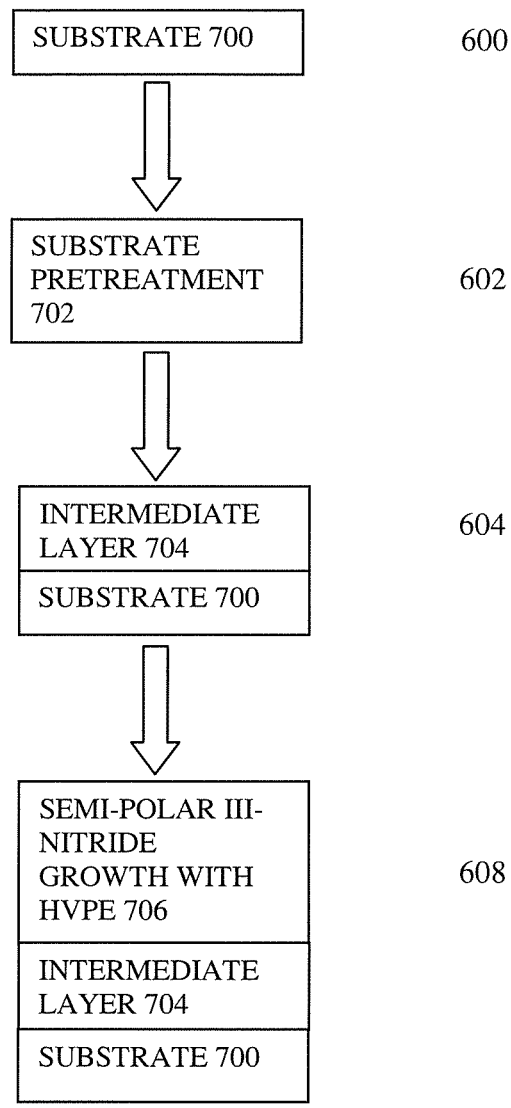
FIG. 6 further illustrates the results of the processing steps of FIG. 5 according to the preferred embodiment of the present invention.

FIG. 5 is a flowchart that illustrates the processing steps for growing a planar semi-polar III-Nitride epitaxial film using HVPE according to the preferred embodiment of the present invention, wherein the planar semi-polar III-Nitride epitaxial film may comprise a planar semi-polar {11-22} or (10.3) GaN epitaxial layer. FIG. 6 further illustrates the results of each of the processing steps of FIG. 5.

Block 600 represents a suitable substrate (700). The substrate (700) may comprise an m sapphire or any substrate that is suitable for semi-polar plane III-Nitride growth.

Block 602 represents in situ pretreatment of the substrate (700), for example, in an argon and ammonia atmosphere prior to the growth step.

Block 604 represents growing an intermediate layer (704) on the substrate (700). The intermediate layer (704) typically comprises an aluminum nitride (AlN) layer or aluminum-gallium nitride (AlGaN) layer, but may comprise any other intermediate layer (704) that is appropriate for semi-polar plane III-Nitride growth. Moreover, the intermediate layer (704) may be grown after the substrate pretreatment, and prior to the semi-polar plane III-Nitride growth.

Block 606 represents growing the semi-polar plane III-Nitride epitaxial layer (706) using HVPE. The semi-polar plane III-Nitride epitaxial layer (706) typically comprises a non-polar (11-22) plane GaN epitaxial layer, but may comprise other semi-polar plane III-Nitride epitaxial layers as well such as (10-13). Moreover, the semi-polar plane III-Nitride epitaxial layer (706) may be grown on the intermediate layer (704). Preferably, the end result is a device, or a free standing wafer, or a substrate, or a template, having a planar epitaxial layer of the semi-polar plane III-Nitride.

Possible Modifications and Variations

Although the preferred embodiment describes the HVPE growth of semi-polar GaN on m sapphire using an AlN or AlGaN interlayer, alternative suitable substrates, on which the semi-polar plane III-Nitride epitaxial film could be formed, include, but are not limited to, 6H or 4H m-plane SiC, freestanding m-GaN, LiGaO$_2$ and LiAlO$_2$.

Prior to growth, the suitable substrate can be treated in many different ways in-situ or ex-situ, or it may not be treated at all.

The semi-polar epitaxial film can be nucleated and grown over different nucleation layers, such as GaN or AlN, or AlGaN grown at various conditions and methods, or over a bare substrate.

The epitaxial film can be any semi-polar plane III-Nitride material including, but not limited to, GaN, AlN, AlGaN and InGaN with various thicknesses.

The growth parameters required for the growth of semi-polar plane III-Nitride material may vary from reactor to reactor.

Finally, it is understood that processing steps may be omitted, added or rearranged as desired.

Such variations do not fundamentally alter the general practice of this invention.

Advantages and Improvements

The growth of non-polar{1-100} plane GaN has been successfully demonstrated by HVPE and MBE but only successfully on m-plane GaN substrates. However, the present invention is the first-ever successful demonstration of high-quality planar semi-polar {11-22} and {10-13} plane GaN growth by HVPE.

Growth of planar semi-polar GaN has an advantage over growth of planar a-{11-20} GaN with HVPE in terms of its stability with a large growth window. This was shown when growth variables such as temperature, V/III ratio, precursor flows for AlN (AlGaN) intermediate layer and GaN epitaxial film were changed.

To accomplish the optimum quality semi-polar (11-22) GaN layer, V/III ratios of 6-15 and 15-25 and temperature series of 900° C. to 1050° C. and 900° C. to 1050° C. for MN (AlGaN) intermediate layers and GaN layers were tested, respectively. Alterations in such conditions did not affect the crystal and surface quality significantly unlike the planar non-polar a-plane GaN films in which crystal and surface quality are extremely susceptible to change in growth conditions and constrained with small growth window.

The growth stability advantage combined with the semi-polar nature of GaN brings new possibilities in III-Nitride non-polar device research.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, such as additional adjustments to the process described herein, without fundamentally deviating from the essence of the present invention. It is intended that the scope of the invention be limited not by this detailed description, but rather by the claims appended hereto.

What is claimed is:

1. A method of growing planar semi-polar Gallium-Nitride epitaxial film, comprising: pretreating an m-sapphire substrate in an atmosphere of ammonia and argon, annealing the pretreated m-sapphire substrate in an atmosphere of ammonia and hydrogen chloride, growing an intermediate layer of aluminum nitride (AlN) or aluminum-gallium nitride (AlGaN) of a thickness below 100 nm and grown at V/III ratios of 6-15 or 15-25 and at a temperature in the range of 900° C. to 1050° C. on the annealed, pretreated m-sapphire substrate, and growing semi-polar{11-22} or {10-13} planar Gallium-Nitride on the intermediate layer, the intermediate layer and the semi-polar{11-22} or {10-13} plane Gallium-Nitride being grown using hydride vapor phase epitaxy (HVPE).

* * * * *